(12) United States Patent
Son et al.

(10) Patent No.: US 10,500,605 B2
(45) Date of Patent: Dec. 10, 2019

(54) APPARATUS AND METHOD FOR COATING ELECTRODE ACTIVE MATERIAL SLURRY

(71) Applicant: LG Chem, Ltd., Seoul (KR)

(72) Inventors: Jin-Young Son, Daejeon (KR);
Taek-Soo Lee, Daejeon (KR);
Hyun-Won Lee, Daejeon (KR);
Ki-Won Sung, Daejeon (KR); Do-Hwa Jung, Daejeon (KR)

(73) Assignee: LG Chem, Ltd. (KR)

( * ) Notice: Subject to any disclaimer, the term of this patent is extended or adjusted under 35 U.S.C. 154(b) by 0 days.

(21) Appl. No.: 15/556,533

(22) PCT Filed: Jun. 9, 2016

(86) PCT No.: PCT/KR2016/006138
§ 371 (c)(1),
(2) Date: Sep. 7, 2017

(87) PCT Pub. No.: WO2017/018656
PCT Pub. Date: Feb. 2, 2017

(65) Prior Publication Data
US 2018/0050365 A1     Feb. 22, 2018

(30) Foreign Application Priority Data

Jul. 28, 2015   (KR) .................. 10-2015-0106650

(51) Int. Cl.
*B05C 5/02*     (2006.01)
*H01M 4/04*     (2006.01)
(Continued)

(52) U.S. Cl.
CPC .............. *B05C 5/0254* (2013.01); *B05C 9/06* (2013.01); *B05D 1/26* (2013.01); *H01L 21/00* (2013.01);
(Continued)

(58) Field of Classification Search
CPC .... B05C 9/06; B05D 1/26; B05D 5/12; B05D 2202/00; B05D 2252/02; H01L 21/00;
(Continued)

(56) References Cited

U.S. PATENT DOCUMENTS

2011/0070479 A1    3/2011  Matsuda et al.
2012/0032157 A1*   2/2012  Kawabe ................. B05D 1/265
                                                    257/40

(Continued)

FOREIGN PATENT DOCUMENTS

JP     2002204058 A  *  7/2002
JP     2008253927 A     10/2008

(Continued)

OTHER PUBLICATIONS

JP-2008296075-A, Machine Translation, originally published Dec. 2008, p. 1-8 (Year: 2008).*

(Continued)

*Primary Examiner* — Katherine A Bareford
*Assistant Examiner* — Christina D McClure
(74) *Attorney, Agent, or Firm* — Lerner, David, Littenberg, Krumholz & Mentlik, LLP

(57) ABSTRACT

An apparatus for coating electrode active material slurry includes: a transfer unit continuously transferring an electrode current collector in a predetermined process direction; and a coating die which is reciprocally movable in the process direction or an opposite direction to the process direction and coats the active material slurry on a predetermined coating area of the electrode current collector transferred by the transfer unit, wherein the coating die stands by at a predetermined coating start position and, when a balcony region corresponding to a leading end of the coating area reaches the coating start position, coats the active material slurry on the balcony region while moving from the (Continued)

coating start position to a main coating position that is spaced apart from the coating start position by a predetermined distance in the opposite direction.

9 Claims, 4 Drawing Sheets

(51) Int. Cl.
*H01M 10/04* (2006.01)
*B05D 1/26* (2006.01)
*H01M 10/0525* (2010.01)
*H01M 10/0585* (2010.01)
*H01L 21/00* (2006.01)
*B05C 9/06* (2006.01)
*B05D 5/12* (2006.01)

(52) U.S. Cl.
CPC ........... *H01M 4/04* (2013.01); *H01M 4/0402* (2013.01); *H01M 4/0404* (2013.01); *H01M 10/04* (2013.01); *H01M 10/0404* (2013.01); *H01M 10/0525* (2013.01); *H01M 10/0585* (2013.01); *B05D 5/12* (2013.01); *B05D 2202/00* (2013.01); *B05D 2252/02* (2013.01)

(58) Field of Classification Search
CPC .... H01M 4/04; H01M 4/0402; H01M 4/0404; H01M 10/04; H01M 10/0404; H01M 10/0525; H01M 10/0585
USPC .......................................................... 427/58
See application file for complete search history.

(56) References Cited

U.S. PATENT DOCUMENTS

| 2012/0034380 | A1* | 2/2012 | Kim | B05C 5/0254 |
| | | | | 427/256 |
| 2012/0315380 | A1* | 12/2012 | Suzuki | B05D 1/26 |
| | | | | 427/8 |
| 2014/0030598 | A1* | 1/2014 | Sakano | H01M 4/366 |
| | | | | 429/231.1 |
| 2015/0336114 | A1* | 11/2015 | Wakamoto | B05C 5/0216 |
| | | | | 118/323 |

FOREIGN PATENT DOCUMENTS

| JP | 2008296075 A | * | 12/2008 |
| JP | 2011198596 A | | 10/2011 |
| JP | 2012216375 A | | 11/2012 |
| JP | 2013062302 A | | 4/2013 |
| JP | 5721593 B2 | | 5/2015 |
| KR | 100646550 B1 | | 11/2006 |
| KR | 100670487 B1 | | 1/2007 |
| KR | 101199099 B1 | | 11/2012 |
| KR | 101212201 B1 | | 12/2012 |

OTHER PUBLICATIONS

JP-2002204058-A, machine translation, originally published 2002, p. 1-12 (Year: 2002).*
Search report from International Application No. PCT/KR2016/006138, dated Oct. 4, 2015.

* cited by examiner

APPARATUS AND METHOD FOR COATING ELECTRODE ACTIVE MATERIAL SLURRY

CROSS-REFERENCE TO RELATED APPLICATIONS

The present application is a national phase entry under 35 U.S.C. § 371 of International Application No. PCT/KR2016/006138, filed Jun. 9, 2016, which claims priority from Korean Patent Application No. 10-2015-0106650, filed Jul. 28, 2015, all of which are hereby incorporated herein by reference.

TECHNICAL FIELD

The present disclosure relates to an apparatus and method of coating electrode active material slurry to coat the active material slurry on an electrode current collector.

BACKGROUND ART

Recently, there is an increasing interest in energy storage technology. For example, as applications of energy storage technology are expanded to mobile phones, camcorders, notebook PCs, and electric vehicles, efforts for research and development of energy storage technology are gradually materialized. Electrochemical devices are the most spotlighted field among the fields of energy storage technology, and interests are focused on the development of chargeable and dischargeable secondary batteries among the electrochemical devices. In particular, recently, in developing secondary batteries, research and development for design of novel electrodes and batteries are being carried out to improve capacity density and specific energy.

Since lithium secondary batteries among such secondary batteries have advantages of higher operation voltage and much greater energy density than conventional batteries using an aqueous solution (electrolyte), the lithium secondary batteries are widely used in various fields requiring energy storage technology.

A process of manufacturing a lithium secondary battery includes a process of forming an electrode active material layer on an electrode current collector. The process of forming the electrode active material layer includes coating active material slurry, in which electrode active material particles are dispersed in a binder solution, on the electrode current collector, and forming the electrode active material layer on the electrode current collector by removing the solution and water present in the active material slurry by drying the active material slurry coated on the electrode current collector.

FIG. 1 is a schematic diagram illustrating a conventional apparatus for coating electrode active material slurry, FIG. 2 is a partially enlarged view of a region I of FIG. 1, FIG. 3 is a partially enlarged view of a region II of FIG. 2, and FIG. 4 is a partially enlarged view of a region III of FIG. 2.

As shown in FIG. 1, a conventional apparatus 1 for coating electrode active material slurry, for performing a process of forming the electrode active material layer set forth above, includes: a supply roll 10 unwinding an electrode current collector E wound in a roll shape and continuously supplying the electrode current collector E in a predetermined process direction; a coating die 20 coating an active material slurry S, which is supplied from an external slurry supply source (not shown), on the electrode current collector E continuously moving in the process direction; a dryer 30 forming an electrode active material layer A on the electrode current collector E by drying the active material slurry S coated on the electrode current collector E; and a recovery roll 40 recovering the electrode current collector E, on which the electrode active material layer A is formed, in a roll state by winding the electrode current collector E.

Here, as shown in FIG. 2, the coating die 20 coats the active material slurry S on coating areas T of the electrode current collector E, the coating areas T being arranged at predetermined intervals. The coating die 20 is fixed and mounted at a predetermined position so as to face the coating areas T of the electrode current collector E, whereas the electrode current collector E is continuously moved along the process direction. Thus, when the active material slurry S ejected from the coating die 20 encounters the coating areas T of the electrode current collector E, inertial force I acts on the active material slurry S in an opposite direction to a moving direction of the electrode current collector E, that is, in an opposite direction to the process direction.

In addition, as shown in FIG. 2, the active material slurry S is selectively coated only on the coating areas T instead of being continuously coated throughout all regions of the electrode current collector E, and has a high coefficient of viscosity due to physical properties thereof. Thus, as shown in FIG. 2, in each of the coating areas T, viscous force V selectively acts on the active material slurry S coated on a balcony region B only in the opposite direction, selectively acts on the active material slurry S coated on a drag region D only in the process direction, and acts on the active material slurry S coated on a main coating region M in both the process direction and the opposite direction. Here, the balcony region B corresponds to a leading end of each of the coating areas T and refers to a region on which coating of the active material slurry S begins; the drag region D corresponds to a trailing end of each of the coating areas T and refers to a region on which coating of the active material slurry S is terminated; and the main coating region M corresponds to a middle portion of each of the coating areas T and refers to a region between the balcony region B and the drag region D.

As such, both the inertial force I and the viscous force V act on the active material slurry S coated on the balcony region B in the opposite direction. Thus, the active material slurry S coated on the balcony region B is biased in the opposite direction. However, since the main coating region M is in a location corresponding to the opposite direction with respect to the balcony region B, the active material slurry S coated on the balcony region B is supported by the active material slurry S coated on the main coating region M when biased in the opposite direction. Therefore, as shown in FIG. 3, the active material slurry S is coated in a bulging shape on the balcony region B.

The inertial force I acts on the active material slurry S coated on the drag region D in the opposite direction, and the viscous force V acts on the active material slurry S coated on the drag region D in the process direction. However, when the moving speed of the electrode current collector E is considered, since the magnitude of the inertial force I is generally greater than the magnitude of the viscous force V, a portion of the inertial force I remaining after canceled out by the viscous force V acts on the active material slurry S coated on the drag region D in the opposite direction. Thus, the active material slurry S coated on the drag region D is biased in the opposite direction. However, even though biased in the opposite direction, the active material slurry S coated on the drag region D, unlike the active material slurry S coated on the balcony region B, is not supported by the active material slurry S coated on the main coating region M. Therefore, as shown in FIG. 4, the active material slurry S is sharply coated on the drag region D such that the coating thickness thereof decreases along the opposite direction.

In addition, when coating of the active material slurry S on the electrode current collector E is terminated, that is, when the coating die 20 terminates the ejection of the active material slurry S, the ejection of the active material slurry S is gradually terminated over certain time instead of being terminated all at once. Thus, when the coating die 20 coats the active material slurry S on the drag region D, an ejection amount of the active material slurry S per unit time is gradually reduced such that the ejection of the active material slurry S onto the electrode current collector E may be terminated. Therefore, the active material slurry S is sharply coated on the drag region D such that the coating thickness thereof further decreases along the opposite direction.

The inertial force I acts on the active material slurry S coated on the main coating region M in the opposite direction, and the viscous force V acts on the active material slurry S coated on the main coating region M in both the process direction and the opposite direction. Thus, although the inertial force I causes the active material slurry S coated on the main coating region M to be biased in the opposite direction, the viscous force V causes the active material slurry S, which is biased in the opposite direction by the inertial force I, to be spread flat. Therefore, as shown in FIG. 2, the active material slurry S is coated relatively flat on the main coating region M.

To sum up the above descriptions, the active material slurry S is coated in a bulging shape on the balcony region B such that the coating thickness thereof is relatively higher than the coating thickness of the active material slurry S coated on the other regions, and the active material slurry S is sharply coated on the drag region D such that the coating thickness thereof is relatively lower than the coating thickness of the active material slurry S coated on the other regions.

As such, since the balcony region B and the drag region D, in which non-uniformity of the coating thickness of the active material slurry S occurs, may cause a problem in processability or the performance of a secondary battery when used in a manufacturing process of the secondary battery, the balcony region B and the drag region D are not used in the manufacturing process of the secondary battery and are discarded. Therefore, in the case of the conventional apparatus 1 of coating electrode active material slurry, since a non-uniform coating thickness region not used in a manufacturing process of a secondary battery, that is, a dead space is generated in the electrode current collector E, there is a problem of deterioration in economic efficiency and yield.

To solve the above problems, a method of mixing an additive with the active material slurry S has been conceived such that non-uniformity of the coating thickness of the active material slurry S does not occur in the balcony region B and the drag region D. However, when an additive is mixed with the active material slurry S, an overall composition of the active material slurry S needs to be changed according to a material of the additive. Therefore, the method of mixing an additive with the active material slurry S has a problem of deterioration in economic efficiency.

DISCLOSURE

Technical Problem

The present disclosure is designed to solve the problems of the related art, and therefore the present disclosure is directed to providing an apparatus and method of coating active material slurry, the apparatus having an improved structure such that non-uniformity of the coating thickness of the active material slurry does not occur when the active material slurry is coated on an electrode current collector.

In addition, the present disclosure is directed to providing an apparatus and method of coating active material slurry, the apparatus having an improved structure such that non-uniformity of the coating thickness of the active material slurry may be prevented even without change of a composition of the active material slurry.

Technical Solution

In one aspect of the present disclosure, there is provided an apparatus for coating electrode active material slurry, the apparatus including: a transfer unit configured to continuously transfer an electrode current collector in a predetermined process direction; and a coating die configured to be reciprocally movable in the process direction or an opposite direction to the process direction and coat the active material slurry on a predetermined coating area of the electrode current collector transferred by the transfer unit, wherein the coating die stands by at a predetermined coating start position and, when a balcony region of the coating area, on which coating of the active material slurry begins, reaches the coating start position, coats the active material slurry on the balcony region while moving from the coating start position to a main coating position that is spaced apart from the coating start position by a predetermined distance in the opposite direction.

Preferably, the coating die is moved at a speed equal to a moving speed of the electrode current collector while moving from the coating start position to the main coating position.

Preferably, when reaching the main coating position, the coating die coats the active material slurry on a main coating region while stopped, the main coating region located between the balcony region and a drag region of the coating area, on which the coating of the active material slurry is terminated.

Preferably, when the drag region reaches the main coating position, the coating die coats the active material slurry on the drag region while moving from the main coating position to a coating end position that is spaced apart from the main coating position by a predetermined distance in the process direction.

Preferably, the coating die is moved at a speed equal to a moving speed of the electrode current collector while moving from the main coating position to the coating end position.

Preferably, the coating start position and the coating end position are a same position.

In another aspect of the present disclosure, there is also provided an apparatus for coating electrode active material slurry, the apparatus including: a transfer unit configured to continuously transfer an electrode current collector in a predetermined process direction; and a coating die configured to be reciprocally movable in the process direction or an opposite direction to the process direction and coat the active material slurry on a predetermined coating area of the electrode current collector transferred by the transfer unit, wherein the coating die coats the active material slurry on the coating area while stopped at a predetermined main coating position and, when a drag region, on which coating of the active material slurry is terminated, reaches the main coating position, coats the active material slurry on the drag region while moving from the main coating position to a coating end position that is spaced apart from the main coating position by a predetermined distance in the process direction.

In a further aspect of the present disclosure, there is also provided a method of coating electrode active material slurry such that the active material slurry is coated, by using a coating die, on a coating area of an electrode current collector continuously transferred in a predetermined process direction, the method including: (a) a coating start process in which, while the coating die stands by at a predetermined coating start position, when a balcony region of the coating area, on which coating of the active material slurry begins, reaches the coating start position, the coating die coats the active material slurry on the balcony region while moving from the coating start position to a main coating position that is spaced apart from the coating start position by a predetermined distance in an opposite direction to the process direction; (b) a main coating process in which, when the coating die reaches the main coating position, the coating die coats the active material slurry on a main coating region of the coating area while stopped, the main coating region located between the balcony region and a drag region of the coating area, on which coating of the active material slurry is terminated; and (c) a coating end process in which, when the drag region reaches the main coating position, the coating die coats the active material slurry on the drag region while moving from the main coating position to a coating end position that is spaced apart from the main coating position by a predetermined distance in the process direction.

Preferably, in the operation (a), the coating die is moved in the opposite direction at a speed equal to a moving speed of the electrode current collector.

Preferably, in the operation (c), the coating die is moved in the process direction at a speed equal to a moving speed of the electrode current collector.

Preferably, the coating start position and the coating end position are a same position.

Advantageous Effects

The apparatus and method of coating the electrode active material slurry, according to the present disclosure, gives the following effects.

Firstly, according to the present disclosure, when the active material slurry is coated on the balcony region of the coating area of the electrode current collector, on which coating of the active material slurry begins, the coating die is moved in an opposite direction to a moving direction of the electrode current collector such that a coating amount of the active material slurry per unit area for the balcony region is reduced, whereby the active material slurry may be coated to a uniform thickness on the balcony region.

Secondly, according to the present disclosure, when the active material slurry is coated on the drag region of the coating area of the electrode current collector, on which coating of the active material slurry is terminated, the coating die is moved in a same direction as the moving direction of the electrode current collector such that the coating amount of the active material slurry per unit area for the drag region is increased, whereby the active material slurry may be coated to a uniform thickness on the drag region.

Thirdly, according to the present disclosure, since the active material slurry is coated to a uniform thickness and thus allows minimization of a dead space of the electrode current collector, which is not used in the manufacture of a secondary battery, economic efficiency and yield may be improved.

Fourthly, since the active material slurry may be coated to a uniform thickness on the coating area of the electrode current collector by adjusting a relative speed of the active material slurry with respect to the electrode current collector without change of a composition of the active material slurry, economic efficiency may be further improved.

BEST MODE

Figure 1:
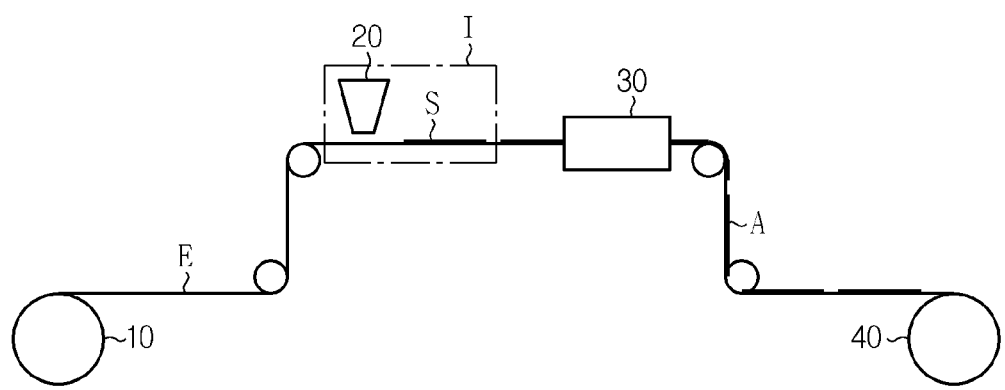
FIG. 1 is a schematic diagram illustrating a conventional apparatus for coating electrode active material slurry.
Figure 2:
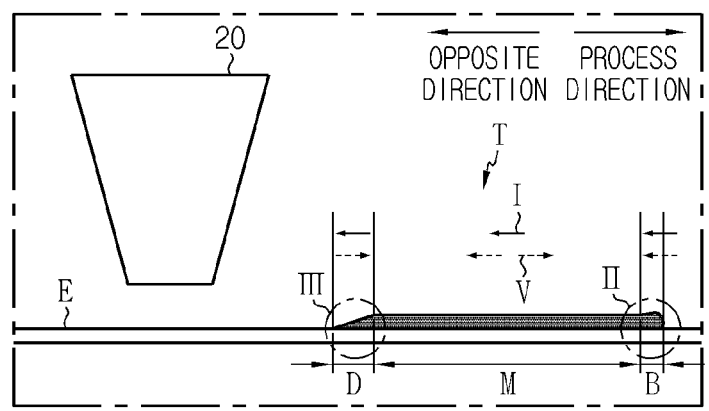
FIG. 2 is a partially enlarged view of a region I of FIG. 1.

It should be understood that the terms used in the specification and the appended claims should not be construed as being limited to general and dictionary meanings, but interpreted based on the meanings and concepts corresponding to technical aspects of the present disclosure on the basis of the principle that the inventor is allowed to define terms appropriately for the best explanation. Therefore, since embodiments described herein and configurations shown in the drawings are merely examples and do not represent all technical aspects of the present disclosure, it should be understood that various equivalents and modifications could be made without departing from the scope of the disclosure.

In the accompanying drawings, the sizes of components or specific portions constituting the components may be exaggerated, omitted or schematically illustrated for convenience and clarity. Therefore, the size of each component does not completely reflect the actual size thereof. Regarding functions and configurations known in the art, descriptions, which may be determined as unnecessarily making a main point of the present disclosure unclear, will be omitted.

Figure 5:
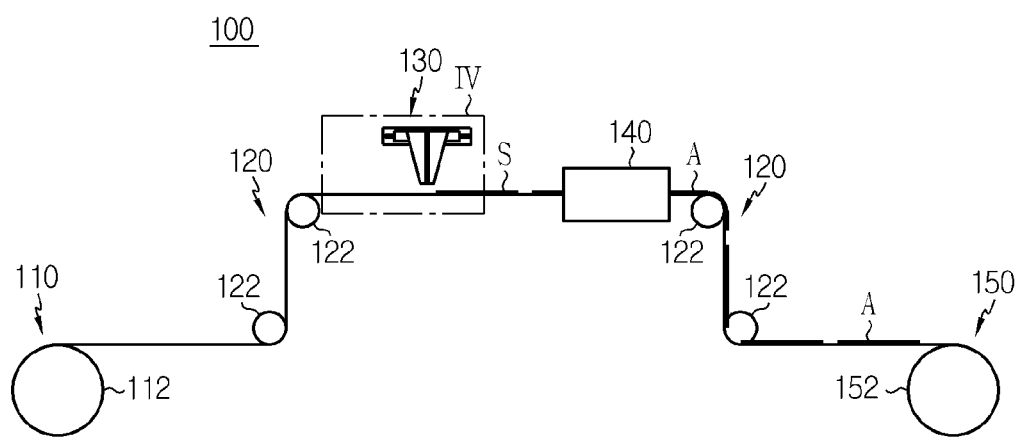
FIG. 5 is a schematic diagram illustrating an apparatus for coating electrode active material slurry, according to a preferred embodiment of the present disclosure.

FIG. 5 is a schematic diagram illustrating an apparatus for coating electrode active material slurry, according to a preferred embodiment of the present disclosure.

Referring to FIG. 5, an apparatus 100 of coating electrode active material slurry, according to a preferred embodiment of the present disclosure, includes: a supply unit 110 configured to continuously supply an electrode current collector E; a transfer unit 120 configured to continuously transfer the electrode current collector E supplied from the supply unit 110 in a predetermined process direction; a coating unit 130 configured to coat an active material slurry S on the electrode current collector E transferred by the transfer unit 120; a drying unit 140 configured to form an electrode active material layer A on the electrode current collector E by drying the electrode current collector E on which the active material slurry S is coated by the coating unit 130; and a recovery roll 152 configured to recovery the electrode current collector E, on which the electrode active material layer A is formed, in a roll state by winding the electrode current collector E.

The supply unit 110 is a device for supplying the electrode current collector E intended to be coated with the active material slurry S. A structure of the supply unit 110 is not particularly limited. For example, as shown in FIG. 5, the supply unit 110 may include a supply roll 112 configured to unwind the electrode current collector E wound in a roll state and continuously supply the electrode current collector E. The kind of the electrode current collector E supplied by the supply unit 110 is not particularly limited, and an electrode current collector E generally used in the manufacture of a secondary battery may be used as the electrode current collector E.

The transfer unit 120 is a device for transferring the electrode current collector E supplied by the supply unit 110 in the predetermined process direction. A structure of the transfer unit 120 is not particularly limited. For example, as shown in FIG. 5, the transfer unit 120 may include a plurality of transfer rolls 122 mounted between the supply unit 110 and a recovery unit 150 at predetermined intervals. Each transfer roll 122 continuously transfers the electrode current collector E supplied by the supply unit 110 along the predetermined process direction while certain tension is applied to the electrode current collector E.

The coating unit 130 is a device for coating the active material slurry S on the electrode current collector E. The coating unit 130 coats the active material slurry S on a predetermined coating area T of the electrode current collector E continuously transferred by transfer unit 120 along the process direction.

The drying unit 140 is a device for forming an electrode active material layer A on the electrode current collector E by drying the active material slurry S coated on the electrode current collector E. As shown in FIG. 5, the drying unit 140 is mounted between a coating die 131 of the coating unit 130 and the recovery roll 152 so as to be capable of drying the active material slurry S coated on the electrode current collector E. Since the drying unit 140 has a same structure as a general drying unit for drying the active material slurry S, further descriptions thereof will be omitted.

The recovery unit 150 is a device for recovering the electrode current collector E on which the electrode active material layer A is formed. A structure of the recovery unit 150 is not particularly limited. For example, as shown in FIG. 5, the recovery unit 150 may include the recovery roll 152 capable of recovering the electrode current collector E in a roll state by winding the electrode current collector E, which passes through the coating unit 130 and the drying unit 140 in this stated order and thus includes the electrode active material layer A formed thereon.

Figure 6:
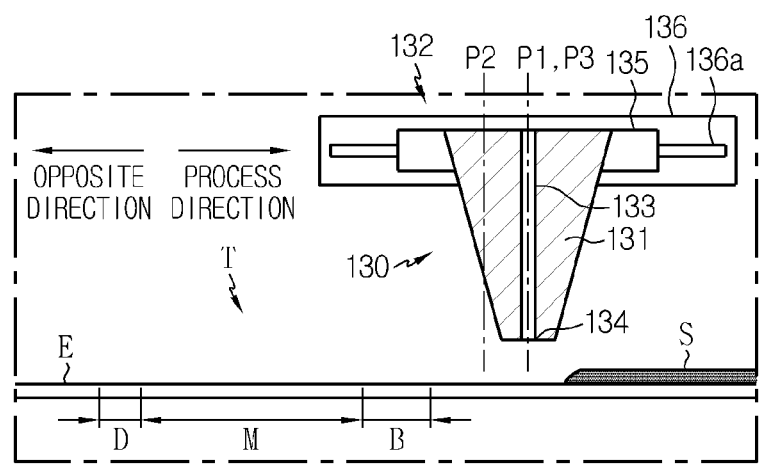
FIG. 6 is a partially enlarged view of a region IV of FIG. 5.

FIG. 6 is a partially enlarged view of a region IV of FIG. 5.

Figure 3:
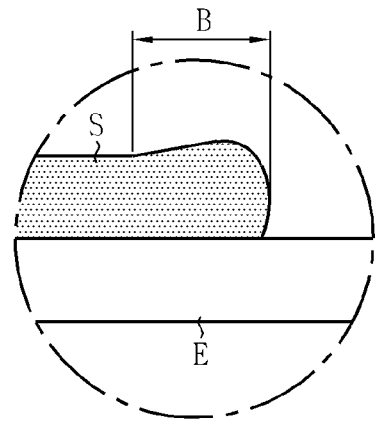
FIG. 3 is a partially enlarged view of a region II of FIG. 2.
Figure 4:
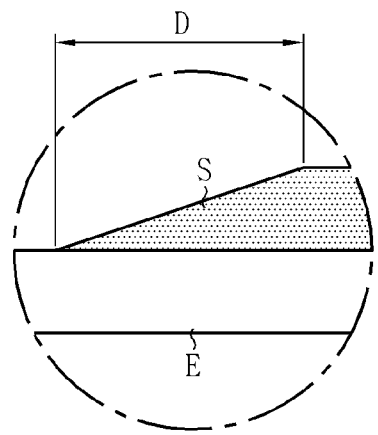
FIG. 4 is a partially enlarged view of a region III of FIG. 2.

When the conventional apparatus 1 of coating electrode active material slurry is used, as shown in FIGS. 3 and 4, due to inertial force I and viscous force V acting on the active material slurry S, the active material slurry S is coated in a bulging shape on the balcony region B such that the coating thickness of the active material slurry S is relatively high, and the active material slurry S is sharply coated on the drag region D such that the coating thickness of the active material slurry S is relatively low. As such, the balcony region B and the drag region D, in which non-uniformity of the coating thickness of the active material slurry S occurs, are not used due to problems in the manufacturing process and performance of a secondary battery. Therefore, the conventional apparatus 1 of coating electrode active material slurry has a problem of deterioration in economic efficiency and yield.

To solve the problems set forth above, as shown in FIG. 6, the coating unit 130 may include: the coating die 131 configured to coat the active material slurry S on the coating area T of the electrode current collector E continuously transferred along the process direction by the transfer unit 120; and a die transfer unit 132 configured to reciprocally transfer the coating die 131 in the process direction or an opposite direction to the process direction.

A structure of the coating die 131 is not particularly limited. For example, as shown in FIG. 6, the coating die 131 includes: a slit 133 through which the active material slurry S is supplied from an external slurry supply source (not shown); and an ejection port 134 configured to eject the active material slurry S passing through the slit 133 toward the electrode current collector E. As shown in FIG. 6, the coating die 131 is coupled to a slider 135 of the die transfer unit 132, which will be described below, such that the ejection port 134 and the coating area T of the electrode current collector E face each other.

Figure 7:
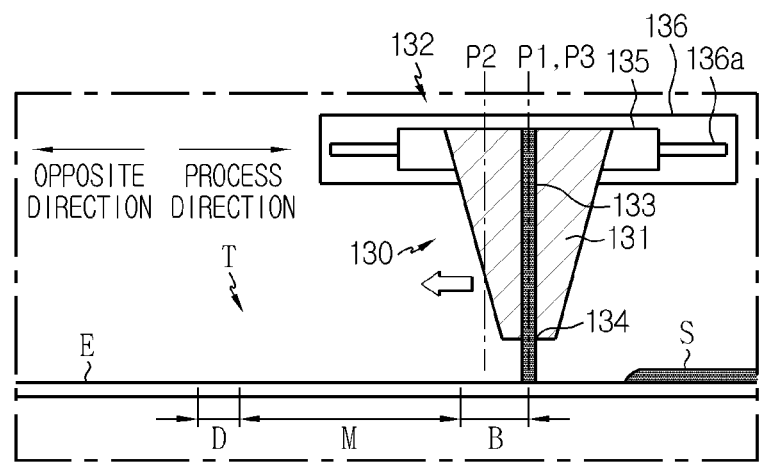
FIG. 7 is a diagram illustrating a method of coating, by a coating unit, active material slurry on a balcony region.
Figure 9:
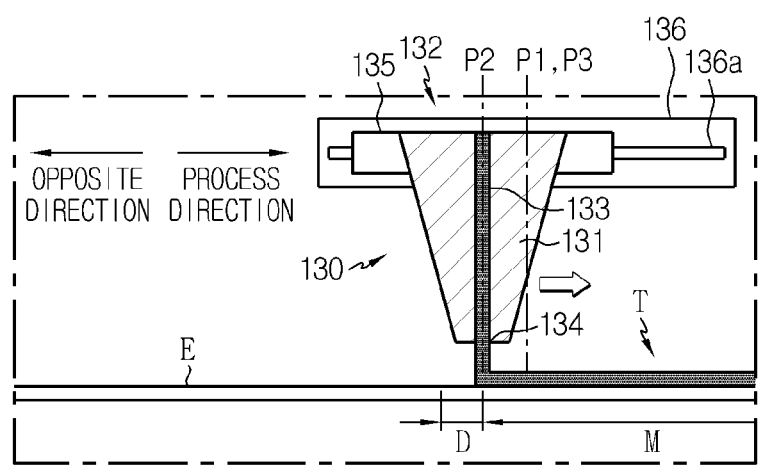
FIG. 9 is a diagram illustrating a method of coating, by the coating unit of FIG. 6, active material slurry on a drag region.

A structure of the die transfer unit 132 is not particularly limited. For example, as shown in FIG. 6, the die transfer unit 132 may include: the slider 135 coupled to the coating die 131; a guide rail 136 including a guide slit 136*a* to which the slider 135 is mounted to be slidably movable in the process direction or the opposite direction; and a drive motor (not shown) configured to transfer the slider 135 along the guide rail 136. As shown in FIGS. 7 and 9, the die transfer unit 132 may reciprocally transfer the slider 135 and the coating die 131 coupled to the slider 135 in the process direction or the opposite direction along the guide rail 136.

Although FIG. 5 shows that the coating die 131 is mounted in a range in which the electrode current collector E is linearly moved, and that the die transfer unit 132 linearly reciprocally moves the coating die 131, the present disclosure is not limited thereto. For example, the coating die 131 may be mounted in a range in which the electrode current collector E is moved in a curvilinear manner, such as a range in which the electrode current collector E passes through the transfer roll 122, and the die transfer unit 132 may reciprocally move the coating die 131 in a curvilinear manner.

Figure 8:
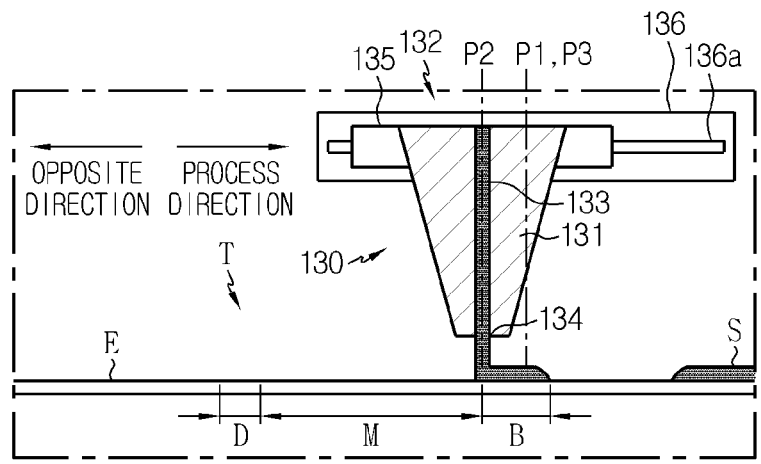
FIG. 8 is a diagram illustrating a method of coating, by the coating unit of FIG. 6, active material slurry on a main coating region.
Figure 10:
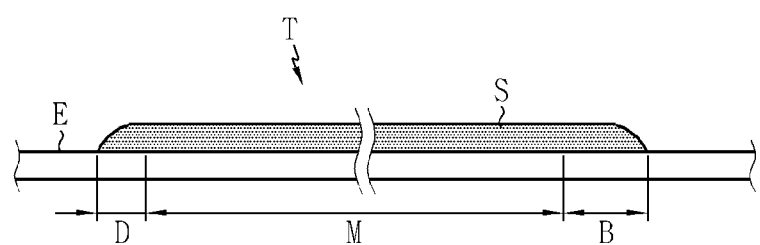
FIG. 10 is a diagram illustrating a state in which the active material slurry is coated on a coating area of an electrode current collector by the coating unit of FIG. 6.

FIG. 7 is a diagram illustrating a method of coating, by the coating unit of FIG. 6, the active material slurry on the balcony region; FIG. 8 is a diagram illustrating a method of coating, by the coating unit of FIG. 6, the active material slurry on the main coating region; FIG. 9 is a diagram illustrating a method of coating, by the coating unit of FIG. 6, the active material slurry on the drag region; and FIG. 10 is a diagram illustrating a state in which the active material slurry is coated on the coating area of the electrode current collector by the coating unit of FIG. 6.

Hereinafter, a method of coating, by the coating unit 130, the active material slurry S on the coating area T of the electrode current collector E will be described with reference to the accompanying drawings.

First, before the balcony region B of the electrode current collector E reaches a predetermined coating start position P1, as shown in FIG. 6, the coating die 131 does not eject the active material slurry S and maintains a standby state, and the die transfer unit 132 arranges the coating die 131 at the predetermined coating start position P1 and then stands by. That is, the coating die 131 stands by at the coating start position P1.

Next, when the balcony region B of the electrode current collector E reaches the coating start position P1, as shown in FIG. 7, the coating die 131 starts ejection of the active material slurry S, and the die transfer unit 132 transfers the coating die 131 at a predetermined moving speed from the coating start position P1 to a main coating position P2 that is spaced apart from the coating start position P1 by a predetermined distance in the opposite direction.

A distance between the coating start position P1 and the main coating position P2 is set such that the active material slurry S ejected from the coating die 131 may be selectively coated on the balcony region B while the coating die 131 is moved from the coating start position P1 to the main coating position P2. Therefore, the distance between the coating start position P1 and the main coating position P2 is determined depending upon process conditions such as an ejection speed of the active material slurry S from the coating die 131, a moving speed of the electrode current collector E, and the like. In addition, the moving speed of the coating die 131 is not particularly limited. For example, the die transfer unit 132 may transfer the coating die 131 in the opposite direction at a speed equal to the moving speed of the electrode current collector E.

In this way, as shown in FIG. 7, the active material slurry S ejected from the coating die 131 is selectively coated on the balcony region B of the coating area T of the electrode current collector E. Since the coating die 131 coats the active material slurry S on the balcony region B while moving in the opposite direction, that is, in an opposite direction to a moving direction of the electrode current collector E, the period of time for which the active material slurry S is coated on the balcony region B is reduced, as compared with the case that the active material slurry S is coated on the balcony region B while the coating die 131 is fixed at a predetermined position like in the conventional apparatus 1 of coating electrode active material slurry. Thus, a coating amount of the active material slurry S per unit area for the balcony region B is reduced, as compared with the case that the active material slurry S is coated on the balcony region B while the coating die 131 is fixed at the predetermined position. Therefore, as shown in FIG. 10, the active material slurry S is coated flat on the balcony region B, a deviation between the coating thickness of the active material slurry S on the balcony region B and the coating thickness of the active material slurry S on the main coating region M is relatively reduced, as compared with that in the conventional apparatus 1 of coating electrode active material slurry.

Next, when the coating die 131 reaches the main coating position P2, as shown in FIG. 8, the coating die 131 continuously ejects the active material slurry S, and the die transfer unit 132 arranges the coating die 131 at the main coating position P2 and then stands by. That is, the coating die 131 continuously ejects the active material slurry S while stopped at the main coating position P2. Thus, as shown in FIG. 10, the active material slurry S is coated flat on the main coating region M.

Next, when the drag region D of the electrode current collector E reaches the main coating position P2, as shown in FIG. 9, the coating die 131 continuously ejects the active material slurry S, and the die transfer unit 132 transfers the coating die 131 at a predetermined moving speed from the main coating position P2 to a coating end position P3 that is spaced apart from the main coating position P2 by a predetermined distance in the process direction.

Preferably, the coating end position P3 is a same position as the coating start position P1, without being limited thereto. That is, the coating end position P3 is set as a same position as the coating start position P1 such that the coating die 131 moved to the main coating position P2 may return to the original position thereof, that is, the coating start position P1. In addition, the moving speed of the coating die 131 is not particularly limited. For example, the die transfer unit 132 may transfer the coating die 131 in the process direction at a speed that is equal to or slightly lower than the moving speed of the electrode current collector E so as to minimize the inertial force I acting on the active material slurry S when the active material slurry S encounters the drag region D of the electrode current collector E.

In this way, as shown in FIG. 10, the active material slurry S ejected from the coating die 131 is selectively coated on the drag region D of the coating area T of the electrode current collector E. Since the coating die 131 coats the active material slurry S on the drag region D while moving in the process direction, that is, in the moving direction of the electrode current collector E, the period of time for which the active material slurry S is coated on the drag region D is increased, as compared with the case that the active material slurry S is coated on the drag region D while the coating die 131 is fixed at a predetermined position like in the conventional apparatus 1 of coating electrode active material slurry. Thus, the coating amount of the active material slurry S per unit area for the drag region D is increased, as compared with the case that the active material slurry S is coated on the drag region D while the coating die 131 is fixed at the predetermined position. Therefore, as shown in FIG. 10, the active material slurry S is coated flat on the drag region D, and a deviation between the coating thickness of the active material slurry S on the drag region D and the coating thickness of the active material slurry S on the main coating region M is relatively reduced, as compared with that in the conventional apparatus 1 of coating electrode active material slurry.

Next, when the coating die 131 reaches the coating end position P3, that is, the coating start position P1, as shown in FIG. 6, the coating die 131 does not eject the active material slurry S and maintains the standby state until the balcony region B of the next coating area T reaches the coating start position P1, and the die transfer unit 132 arranges the coating die 131 at the coating start position P1 and then stands by. That is, the coating die 131 stands by at the coating start position P1 until coating of the active material slurry S on the next coating area T begins.

As such, the apparatus 100 of coating electrode active material slurry may reduce a deviation in the coating thickness of the active material slurry S between the balcony region B, the drag region D and the main coating region M. That is, the apparatus 100 of coating electrode active material slurry may coat the active material slurry S to a uniform thickness throughout all regions of the coating area T of the electrode current collector E such that the electrode current collector E has no portion having a non-uniform thickness of the active material slurry S. Therefore, the apparatus 100 of coating electrode active material slurry minimizes a non-uniform coating thickness region not used in a manufacturing process of a secondary battery, that is, a dead space, thereby improving economic efficiency and yield.

In addition, the apparatus 100 of coating electrode active material slurry moves the coating die 131, which is ejecting the active material slurry S, in the moving direction of the electrode current collector E or an opposite direction to the moving direction such that a relative speed of the active material slurry S with respect to the electrode current collector E is changed, thereby preventing non-uniformity of the coating thickness on the balcony region B and the drag region D. Therefore, since the apparatus 100 of coating electrode active material slurry may coat the active material slurry S to a uniform thickness on the coating area T of the electrode current collector E by adjusting the relative speed of the active material slurry S with respect to the electrode current collector E without change of a composition of the active material slurry S, economic efficiency may be improved.

Although the present disclosure has been described in detail with reference to some embodiments in conjunction with the accompanying drawings, it should be understood that the present disclosure is not limited by the foregoing embodiments, and that various modifications and changes can be made by one of ordinary skill in the art without departing from the scope of the disclosure.

INDUSTRIAL APPLICABILITY

The present disclosure relates to an apparatus and method of coating electrode active material slurry, and in particular, may be applied to industries related to a secondary battery.

What is claimed is:

1. A method of coating electrode active material slurry such that the active material slurry is coated, by using a coating die, on a coating area of an electrode current collector continuously transferred in a predetermined process direction at a constant, predetermined moving speed, the method comprising:
   (a) a coating start process in which, while the coating die stands by at a predetermined coating start position, when a balcony region of the coating area, on which coating of the active material slurry begins, reaches the coating start position and the electrode current collector is moving in the process direction at the moving speed, the coating die coats the active material slurry on the balcony region while moving from the coating start position to a main coating position that is spaced apart from the coating start position by a predetermined distance in an opposite direction to the process direction;
   (b) a main coating process in which, when the coating die reaches the main coating position and the electrode current collector is moving in the process direction at the moving speed, the coating die coats the active material slurry on a main coating region of the coating area while stopped, the main coating region located between the balcony region and a drag region of the coating area, on which coating of the active material slurry is terminated; and
   (c) a coating end process in which, when the drag region reaches the main coating position and the electrode current collector is moving in the process direction at the moving speed, the coating die coats the active material slurry on the drag region while moving from the main coating position to a coating end position that is spaced apart from the main coating position by a predetermined distance in the process direction.

2. The method according to claim 1, wherein, in the operation (a), the coating die is moved in the opposite direction at a speed equal to a moving speed of the electrode current collector.

3. The method according to claim 1, wherein, in the operation (c), the coating die is moved in the process direction at a speed equal to a moving speed of the electrode current collector.

4. The method according to claim 1, wherein the coating start position and the coating end position are a same position.

5. The method according to claim 1, wherein, during the coating start process, the coating die coats the active material slurry on the balcony region while the electrode current collector moves at a first relative speed with respect to the coating die; during the main coating process, the coating die coats the active material slurry on the main coating region while the electrode current collector moves at a second relative speed with respect to the coating die; and, curing the coating end process, the coating die coats the active material slurry on the drag region while the electrode current collector moves at a third relative speed with respect to the coating die; and wherein the first relative speed is larger than the second relative speed, and the second relative speed is larger than the third relative speed.

6. A method of coating electrode active material slurry such that the active material slurry is coated, by using a coating die, on a coating area of an electrode current collector continuously transferred in a predetermined process direction, the method comprising:
   (a) a coating start process in which, while the coating die stands by at a predetermined coating start position, when a balcony region of the coating area, on which coating of the active material slurry begins, reaches the coating start position, the coating die coats the active material slurry on the balcony region while moving from the coating start position to a main coating position that is spaced apart from the coating start position by a predetermined distance in an opposite direction to the process direction, such that the coating die coats the active material slurry on the balcony region while the electrode current collector moves at a first relative speed with respect to the coating die; and
   (b) a main coating process in which, when the coating die reaches the main coating position, the coating die coats the active material slurry on a main coating region of the coating area while stopped, such that the coating die coats the active material slurry on the main coating region while the electrode current collector moves at a second relative speed with respect to the coating die, wherein the main coating region is located between the balcony region and a drag region of the coating area, on which coating of the active material slurry is terminated;
   wherein the first relative speed is larger than the second relative speed.

7. The method according to claim 6, wherein, in the operation (a), the coating die is moved in the opposite direction at a speed equal to a moving speed of the electrode current collector.

8. A method of coating electrode active material slurry such that the active material slurry is coated, by using a coating die, on a coating area of an electrode current collector continuously transferred in a predetermined process direction, the method comprising:
   (a) a main coating process in which, when the coating die reaches the main coating position, the coating die coats the active material slurry on a main coating region of the coating area while stopped, such that the coating die coats the active material slurry on the main coating region while the electrode current collector moves at a first relative speed with respect to the coating die, wherein the main coating region is located between the balcony region and a drag region of the coating area, on which coating of the active material slurry is terminated; and (b) a coating end process in which, when the drag region reaches the main coating position, the coating die coats the active material slurry on the drag region while moving from the main coating position to a coating end position that is spaced apart from the main coating position by a predetermined distance in the process direction, such that the coating die coats the active material slurry on the drag region while the electrode current collector moves at a second relative speed with respect to the coating die;

wherein the first relative speed is larger than the second relative speed.

9. The method according to claim 8, wherein, in the operation (b), the coating die is moved in the process direction at a speed equal to a moving speed of the electrode current collector.

* * * * *